(12) United States Patent
Marash

(10) Patent No.: US 6,332,028 B1
(45) Date of Patent: *Dec. 18, 2001

(54) DUAL-PROCESSING INTERFERENCE CANCELLING SYSTEM AND METHOD

(75) Inventor: Joseph Marash, Haifa (IL)

(73) Assignee: Andrea Electronics Corporation, Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/055,709

(22) Filed: Apr. 7, 1998

Related U.S. Application Data

(63) Continuation-in-part of application No. 08/840,159, filed on Apr. 14, 1997.

(51) Int. Cl.$^7$ ..................................................... H04R 3/00
(52) U.S. Cl. ............................ 381/92; 381/94.7; 367/119
(58) Field of Search ........................... 381/92, 94.7, 94.1; 367/119, 121

(56) References Cited

U.S. PATENT DOCUMENTS

| | | | |
|---|---|---|---|
| 5,825,898 | * | 10/1998 | Marash ..................................... 381/92 |
| 6,084,973 | * | 7/2000 | Green et al. ............................ 381/92 |

* cited by examiner

*Primary Examiner*—Forester W. Isen
*Assistant Examiner*—Brian Tyrone Pendleton
(74) *Attorney, Agent, or Firm*—Frommer Lawrence & Haug LLP; Thomas J. Kowalski

(57) ABSTRACT

A dual-processing interference cancelling system and method for processing a broadband input in a computationally efficient manner. Dual processing divides the input into higher and lower frequency bands and applies adaptive filter processing to the lower frequency band while applying non-adaptive filter processing to the higher frequency band. Various embodiments are shown including those based on sub-bands, broadband processing with band-limited adaptation, and broadband processing with an external main-channel generator.

16 Claims, 14 Drawing Sheets

DUAL-PROCESSING INTERFERENCE CANCELLING SYSTEM AND METHOD

CROSS-REFERENCE TO RELATED APPLICATION

This is a continuation-in-part of U.S. patent application Ser. No. 08/840,159, filed Apr. 14, 1997, entitled 'Dual-Processing Interference Cancelling System and Method,' by inventor Joseph Marash.

BACKGROUND OF THE INVENTION

The present invention relates generally to signal processing, and more specifically to an interference cancelling system and method using a combination of adaptive and non-adaptive filter processing. A system using such a combination of adaptive and non-adaptive filter processing is referred to herein as a dual-processing system.

Interference cancelling systems have a wide range of applications such as directional microphones and hearing aids. An interference cancelling system amplifies a target signal originating from a target source (information source) while suppressing interfering signals ("interferences") originating from interference or noise sources.

Interference cancelling systems using adaptive filters are well-known in the art. An adaptive filter is a filter which can change its characteristics by changing its filter coefficients. The interference cancelling system may be a non-directional system having one or more sensors measuring the signal received from the target to generate a main channel, which has a target signal component and an interference component. The system may include one or more other sensors for measuring the interferences to generate one or more reference channels. The adaptive filter uses the reference channels to cancel the interference component present in the main channel.

Alternatively, the system may be a directional system, well-known in the art, which amplifies a target signal originating from a target source at a particular direction relative to the system and suppresses interferences originating from interference sources at all other directions. In such a directional system, the target signal and the interferences may be detected by an array of spatially distributed sensors forming what is called a beamformer.

A beamformer is a form of spatial filter, itself well-known in the art, which takes inputs from an array of spatially distributed sensors and combines them in such a way that it either enhances or suppresses signals coming from certain directions relative to signals from other directions. Thus it can change the direction of receiving sensitivity without physically moving the sensor array. The inputs are combined for this purpose based on filter coefficients as discussed below.

In non-adaptive beamforming, the filter coefficients of a beamformer are predetermined such that the beamformer can exhibit maximum sensitivity or minimum sensitivity (null) in a predetermined direction. Since the coefficient values are fixed in time, a non-adaptive beamformer cannot dynamically place nulls in the directions of strong interferences existing at particular times as the environment changes.

In adaptive beamforming, in contrast, the spatial filter coefficients of a beamformer are continually updated so that directional sensitivity can be dynamically changed depending on the changing locations of a target source and interference sources. For more details on beamforming, see Van Veen & Buckley, Beamforming: A Versatile Approach to Spatial Filtering, IEEE ASSP Magazine, April 1988, pp. 4–24.

An adaptive beamformer can be implemented for example by using tapped delay lines, forming a finite-impulse-response (FIR) filter having time-varying coefficients which are directly changed as the locations of interference sources change.

Alternatively, the adaptive beamformer can be implemented using an adaptive filter (dealing with temporal signals rather than spatial signals). The adaptive beamformer uses fixed-coefficient tapped delay lines, called a main-channel matrix, to obtain a signal received from the direction of a target and other fixed-coefficient tapped delay lines, called a reference-channel matrix, to obtain interferences received from all other directions. An adaptive filter is used to generate cancelling signals resembling the interferences changing in direction. In this manner, instead of directly changing the coefficients of the tapped delay lines, the implementation achieves the same effect by changing the characteristics of the adaptive filter. The adaptive filter generally subtracts the cancelling signals from the main channel and adjusts the filter weights to minimize the mean-square values of the output. When the filter weights settle, the cancelling signals closely track the interferences so that the output has substantially reduced interference.

For some applications, it is important to be able to process a broadband input, that is, one having a relatively large bandwidth. For example, in hearing applications, speech intelligibility is critical to performance. It is well known that the higher frequency portion of the speech spectrum carries much of the information required for speech intelligibility. For applications such as hearing aids or directional microphones for voice activation systems, good intelligibility requires at least 6 Khz of bandwidth. In fact, professional audio systems will not tolerate a bandwidth of less than 12 Khz.

This bandwidth requirement imposes a severe computational burden on the interference cancelling system using adaptive filter processing. Adaptive filter processing is inherently intensive in computation. It involves performing filter operations to produce an output and further updating filter weights based on the output. All these operations must be performed for each new sample.

In order to extend the operation of an adaptive filter in the discrete time domain from any bandwidth to a broader bandwidth, the sampling rate should be increased to maintain comparable quality. According to the well-known sampling theorem, a sampling rate of at least twice the maximum frequency of an incoming analog signal is required in order to represent the signal completely in the discrete time domain. The increased sampling rate increases the number of operations to be performed per unit time.

Increasing the sampling rate alone is not, however, enough to handle the broader bandwidth. An adaptive filter acts on later samples by observing earlier samples within a given period, as feedback. How well the adaptive filter can react depends on how long the filter can observe the earlier samples. This time period is called an effective time delay through an adaptive filter. The delay is proportional to the number of filter stages, each storing a filter coefficient, divided by the sampling frequency. If the sampling frequency is increased, the number of filter stages should be increased in order to maintain the same effective time delay. The increased number of filter stages also increases the number of operations that must be performed per unit time.

The combination of increasing sampling rate and increasing the number of required filter stages sharply increases the number of operations to be performed by a processor. Thus a simple extension of adaptive filter processing to a broader bandwidth places a disproportionately large computational burden on the system and hence is not desirable.

The simple extension of adaptive filter processing presents another problem for an interference cancelling system using adaptive filter processing. Adaptive interference cancelling systems suffer from signal leakage. The system works well when the reference channel is uncorrelated to the main channel. However, in practice, the reference channel contains some signals correlated to the main channel due to signal leakage from the main channel itself. Adaptive filter processing may then partly cancel the target signal as well the inferences. The signal leakage is more likely to occur at higher frequencies for the following reason.

The reference-channel matrix produces reference channels by creating a null in the target direction (by suppressing signals from the target direction). In order to suppress the signals from the target direction effectively, the null should be as deep as possible in the target direction. The null should also be wide enough to provide some tolerance to those signals slightly off the target direction. It turns out that the null is much wider at lower frequencies than at higher frequencies. Therefore, any mismatch in the sensor array would impact the effectiveness of the null much less at lower frequencies than at higher frequencies. In other words, the system is much more sensitive to a mismatch at higher frequencies than at lower frequencies.

Therefore, there exists a need for an improved interference cancelling system that can process an input of given bandwidth without significantly increasing computational requirements and without the drawbacks of adaptive filter processing at higher frequencies. We note that the invention is applicable to a system of any bandwidth; no minimum bandwidth for its application is intended since it can provide advantages in terms of processing efficiencies or capabilities for any bandwidth.

SUMMARY OF THE INVENTION

Accordingly, it is an object of the present invention to provide an interference cancelling system capable of processing a broadband input without disproportionately increasing the computational burden.

Another object of the invention is to provide an interference cancelling system which can avoid the problems ordinarily encountered at higher frequencies with adaptive filter processing.

These and other objects are achieved in accordance with the present invention by dividing an input spectrum into lower and upper sub-bands and applying adaptive filter processing to the lower sub-band while applying non-adaptive filter processing to the upper sub-band. This dual processing is based on the recognition that the performance of adaptive filter processing becomes worse at higher frequencies. Since non-adaptive filter processing is much lower in computational burden, the overall result is better, performing broadband processing with a significantly lower computational burden.

In a preferred embodiment, a main channel and reference channels are obtained using nonadaptive filter processing. The main channel is then split into lower and upper sub-bands. The reference channels are also split in the same way, but only the lower sub-bands are kept while the upper sub-bands are discarded. An adaptive filter uses the lower sub-band of the main channel and the lower sub-bands of the reference channels to generate cancelling signals which are then subtracted from the lower sub-band of the main channel to produce a lower sub-band output. The lower sub-band output is combined with the upper sub-band of the main channel to reconstruct the broadband output.

In another preferred embodiment, a broadband main channel and broadband reference channels are obtained using non-adaptive filter processing. The broadband main channel or the broadband reference channels are not divided into sub-bands. Instead, the broadband reference channels are low-pass filtered to drive an adaptive filter in the low frequency band to obtain low-frequency cancelling signals. The low-frequency cancelling signals are converted to broadband cancelling signals by up-sampling so that they can be subtracted from the broadband main channel over its entire bandwidth.

In yet another preferred embodiment, an external main-channel generator, such as a commercially available hi-fidelity directional microphone, is used in place of a main matrix to obtain a broadband main channel by taking advantage of the broadband capability of existing hi-fidelity microphones. A low-frequency reference matrix generates low-frequency references, which, in turn, drives an adaptive filter to generate low-frequency cancelling signals. The low-frequency cancelling signals are translated to a broadband cancelling signals by up-sampling so that they can be subtracted from the broadband main channel.

The above-stated objects are preferably achieved in accordance with the present invention using methods which can, as will be apparent to those knowledgeable in this field, readily be implemented in a program controlling a commercially available digital signal processor or a general-purpose microprocessor.

BRIEF DESCRIPTION OF THE DRAWINGS

The objects, features, and advantages of the present invention will be more readily apparent from the following detailed description of the invention in which.

DETAILED DESCRIPTION OF THE INVENTION

A. System Implementation

1. Sub-band Processing

Figure 1:
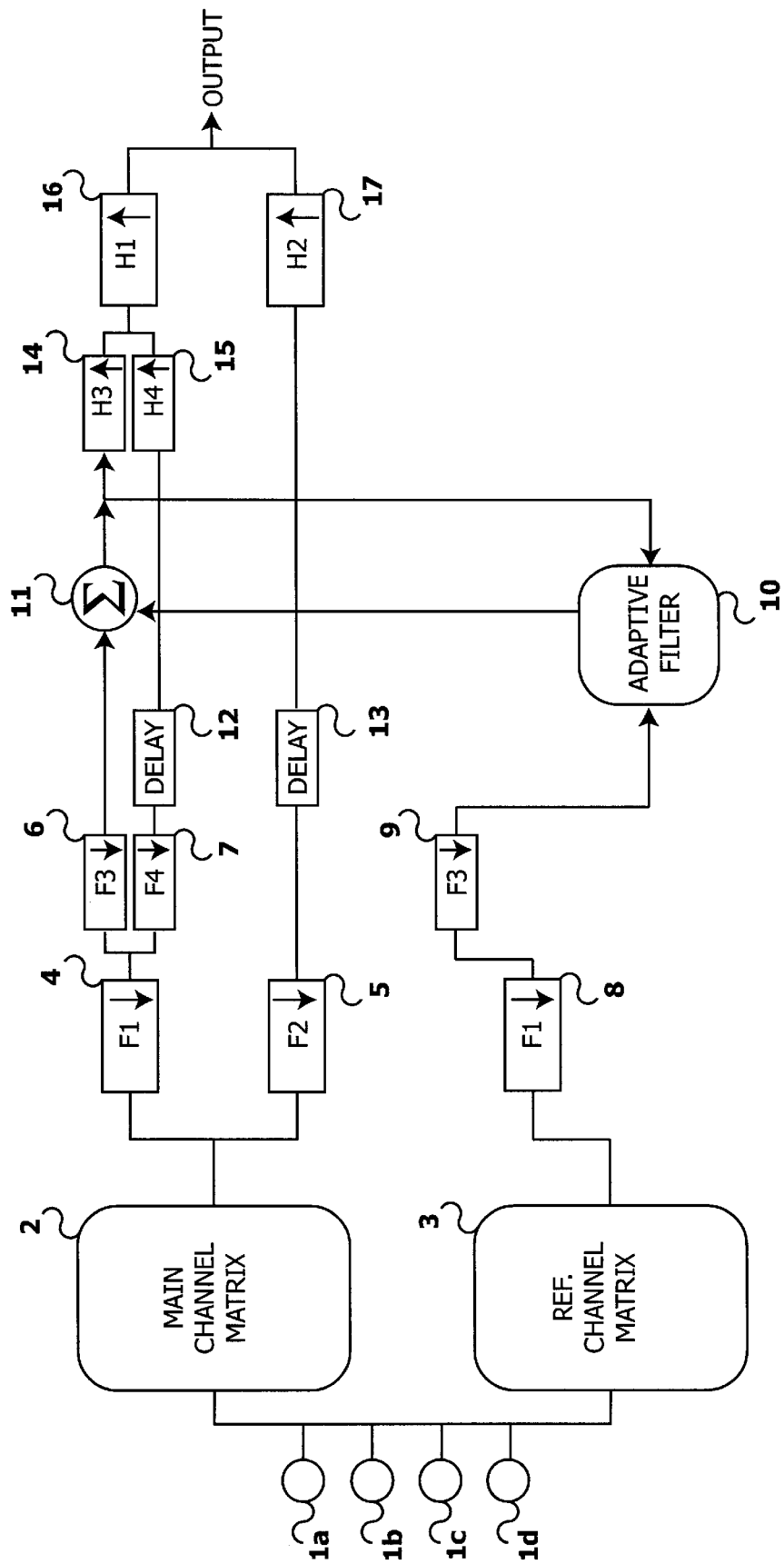
FIG. 1 is a block diagram of a system using sub-band processing.

FIG. 1 shows one preferred embodiment of the present invention using sub-bands where an adaptive filter driven from the sub-bands rather than the entire bandwidth of the input signal. Sub-bands result from partitioning a broader band in any manner as long as the sub-bands can be combined together so that the broader band can be reconstructed without distortions. One may use a so-called "perfect reconstruction structure" as known in the art to split the broadband into sub-bands and to combine the sub-bands together substantially without distortion. For details on perfect reconstruction structures, see P.P. Vaidyanathan, Quadrature Mirror Filter Banks, M-Band Extensions and Perfect-Reconstruction Techniques, IEEE ASSP Magazine, pp. 4–20, July 1987.

In the preferred embodiment, a broader band is partitioned into sub-bands, using several partitioning steps successively through intermediate bands. Broadband inputs from an array of sensors, 1a–1d, are sampled at an appropriate sampling frequency and entered into a main-channel matrix 2 and a reference-channel matrix 3. The main-channel matrix generates a main channel, a signal received in the main looking direction of the sensor array, which contain a target signal component and an interference component. Alternatively, the main channel may be provided by an external main-channel generator such as a shot-gun microphone, a parabolic microphone, or a dipole microphone.

F1, 4, and F2, 5 are splitters which first split the main channel into two intermediate bands, followed by down-sampling by two. Down-sampling is a well-known procedure in digital signal processing. Down-sampling by two, for example, is a process of sub-sampling by taking every other data point. Down-sampling is indicated by a downward arrow in the figure. Splitters F3, 6 and F4, 7 further split the lower intermediate band into two sub-bands followed by down-sampling by two.

In an example using a 16 Khz input signal, the result is a 0–4 Khz lower sub-band with ¼ of the input sampling rate, a 4–8 Khz upper sub-band with ¼ of the input sampling rate, and another upper 8–16 Khz intermediate band with ½ of the input sampling rate.

The reference channels are processed in the same way by filters F1, 8, and F2, 9, to provide only the lower sub-band with ¼ of the input sampling rate, while the other sub-bands are discarded.

The lower sub-bands of the reference channels are fed into an adaptive filter 10, which generates cancelling signals approximating interferences present the main channel. A subtracter 11 subtracts the cancelling signals from the lower sub-band of the main channel to generate an output in the lower sub-band. The output is fed back to the adaptive filter for updating the filter weights. The adaptive filter processing and the subtraction is performed at the lower sampling rate appropriate for the lower sub-band. At the same time the other upper bands of the main channel are delayed by delay units, 12 and 13, each by an appropriate time, to compensate for various delays caused by the different processing each sub-band is going through, and to synchronize them with the other sub-bands. The delay units may be implemented by a series of registers or a programmable delay. The output from the subtracter is combined with the other two sub-bands of the main channel through the reconstruction filters H1–H4, 14–17, to reconstruct a broadband output. H1–H4 may be designed such that they together with F1–F4 provide a theoretically perfect reconstruction without any distortions.

Reconstructors H3 and H4 combine the lower and upper sub-bands into a low intermediate band, followed by an interpolation by two. An interpolation is a well-known procedure in digital signal processing. Interpolation by two, for example, is an up-sampling process increasing the number of samples by taking every other data point and interpolating them to fill as samples in between. Up-sampling is indicated by an upward arrow in the figure. The reconstructors H1, 16 and H2, 17 further combine the two intermediate bands into a broadband.

In the preferred embodiment described, non-adaptive filter processing is performed in the upper sub-band of 4–16 Khz. Adaptive filter processing is performed in the lower sub-band of 0–4 Khz where most of interferences are located. Since there is little computation overhead involved in the non-adaptive filter processing, the use of non-adaptive filter processing in the upper sub-band can reduce the computational burden significantly. The result is superior performance without an expensive increase in the required hardware.

2. Broadband Processing with Band-Limited Adaptation

Figure 2:
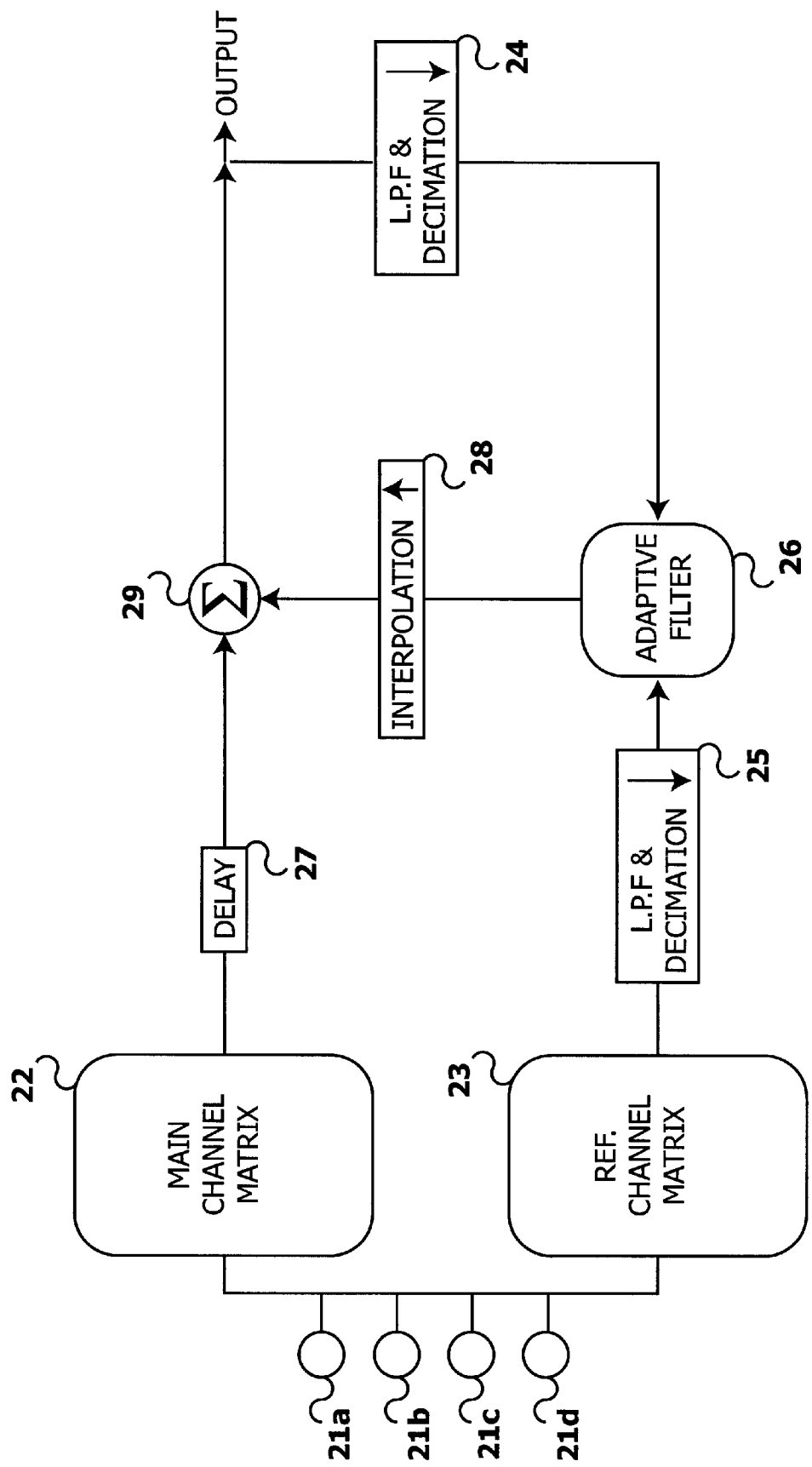
FIG. 2 is a block diagram of a system using broadband processing with frequency-limited adaptation.

FIG. 2 shows another preferred embodiment using broadband processing with band-limited adaptation. Instead of using sub-band cancelling signals which act on a sub-band main channel, the embodiment uses broadband cancelling signals which act on a broadband main channel. But, since adaptive filter processing is done in a low-frequency domain, the resulting cancelling signals are converted to a broadband signal so that it can be subtracted from the broadband main channel.

As before, broadband inputs from an array of sensors, 21a–21d, are sampled at an appropriate sampling frequency and entered into a main-channel matrix 22 and a reference-channel matrix 23. The main-channel matrix generates a main channel, a signal received in the main-looking direction, which has a target signal component and an interference component. The reference-channel matrix generates reference channels representing interferences received from all other directions. A low-pass filter 25 filters the reference channels and down-samples them to provide low-frequency signals to an adaptive filter 26.

The adaptive filter 26 acts on these low-frequency signals to generate low-frequency cancelling signals which estimate a low-frequency portion of the interference component of the main channel. The low-frequency cancelling signals are converted to broadband signals by an interpolator 28 so that they can be subtracted from the main channel by a subtracter 29 to produce a broadband output.

The broadband output is low-pass filtered and down-sampled by a filter 24 to provide a low-frequency feedback signal to the adaptive filter 26. In the mean time, the main channel is delayed by a delay unit 27 to synchronize it with the cancelling signals from the adaptive filter 26.

3. Broadband Processing with an External Main-Channel Generator

Figure 3:
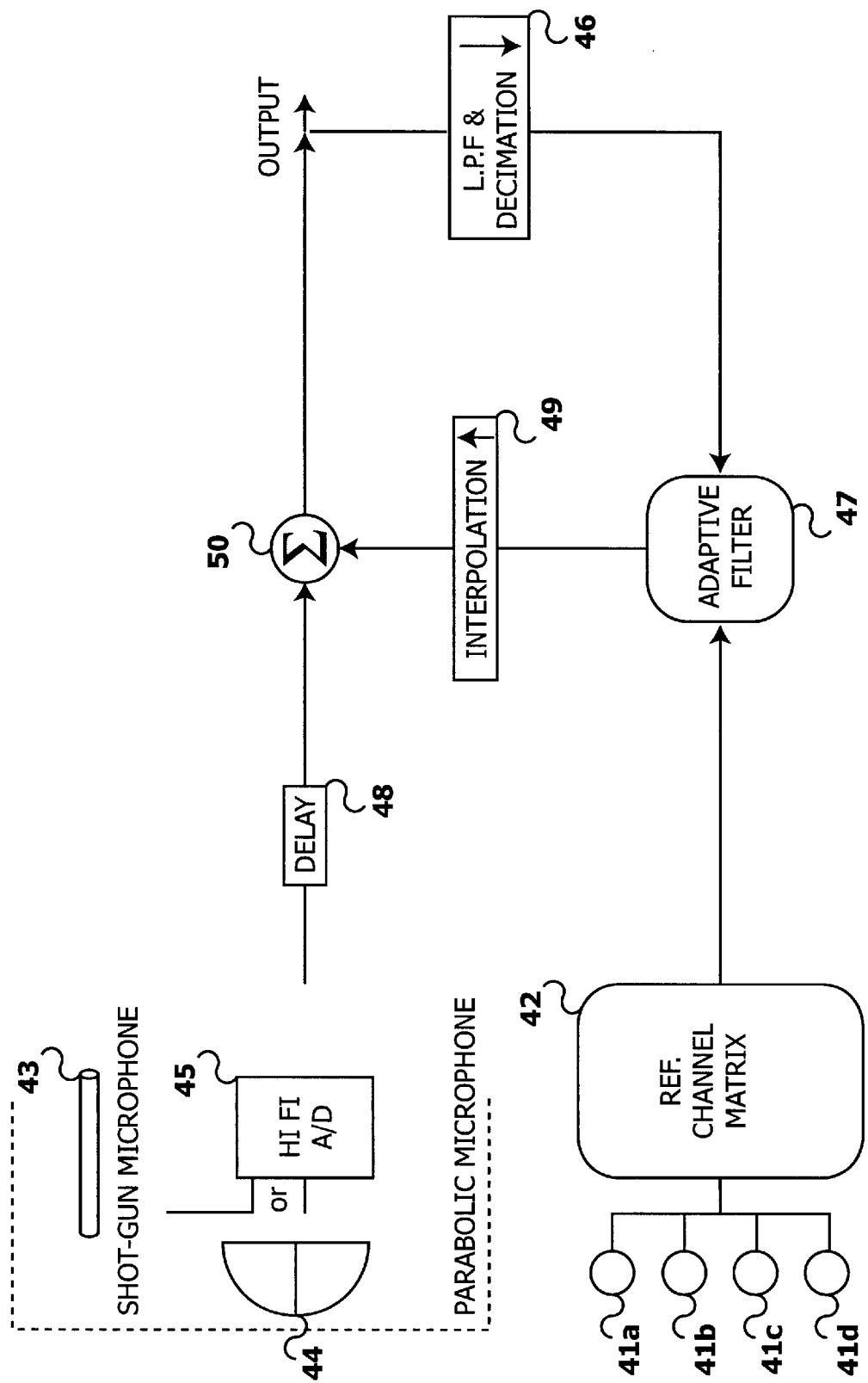
FIG. 3 is a block diagram of a system using broadband processing with an external main-channel generator.
Figure 4A:
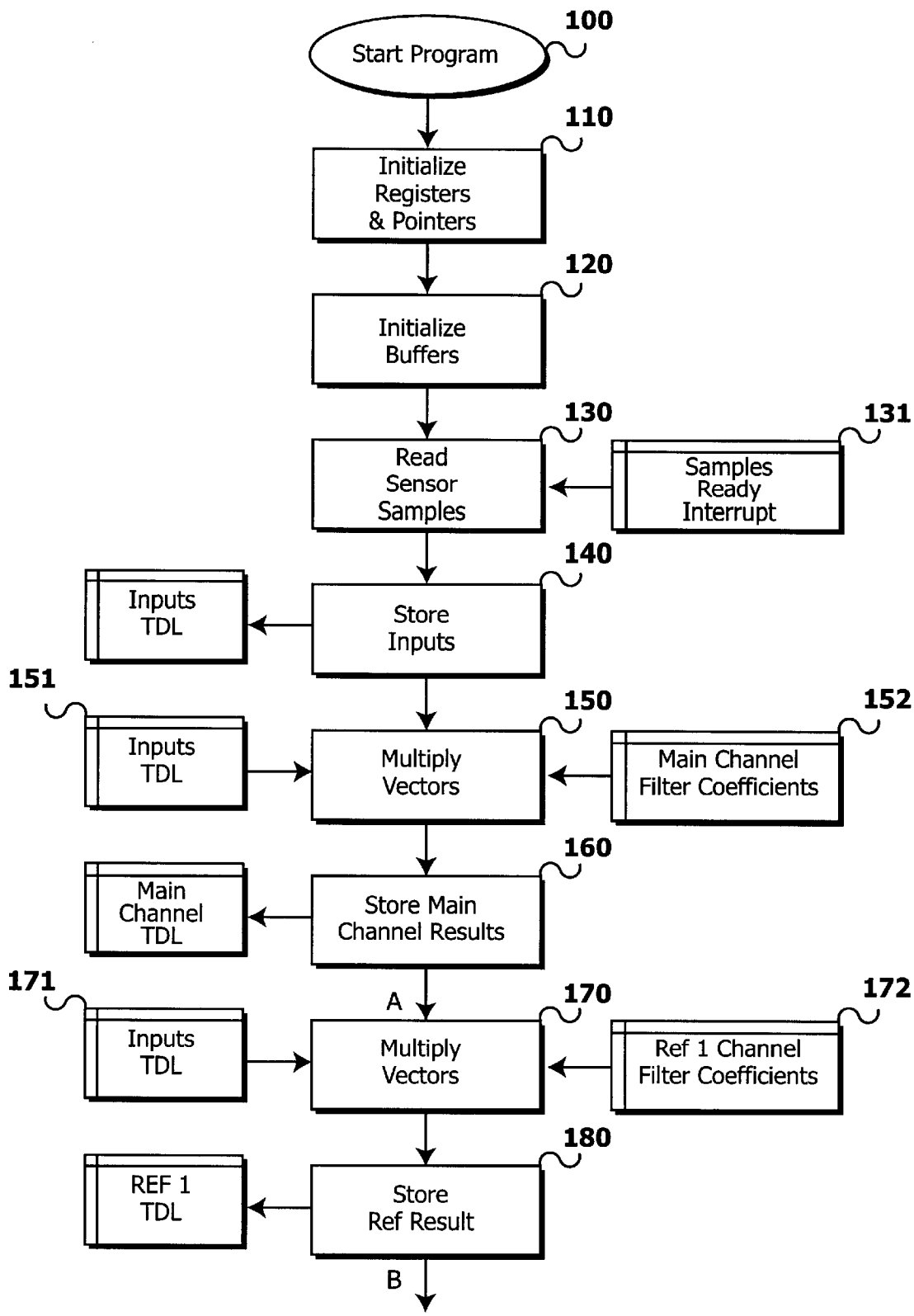
FIGS. 4A–4D are a flow chart depicting the operation of a program that may be used to implement a method using sub-band processing.
Figure 4B:
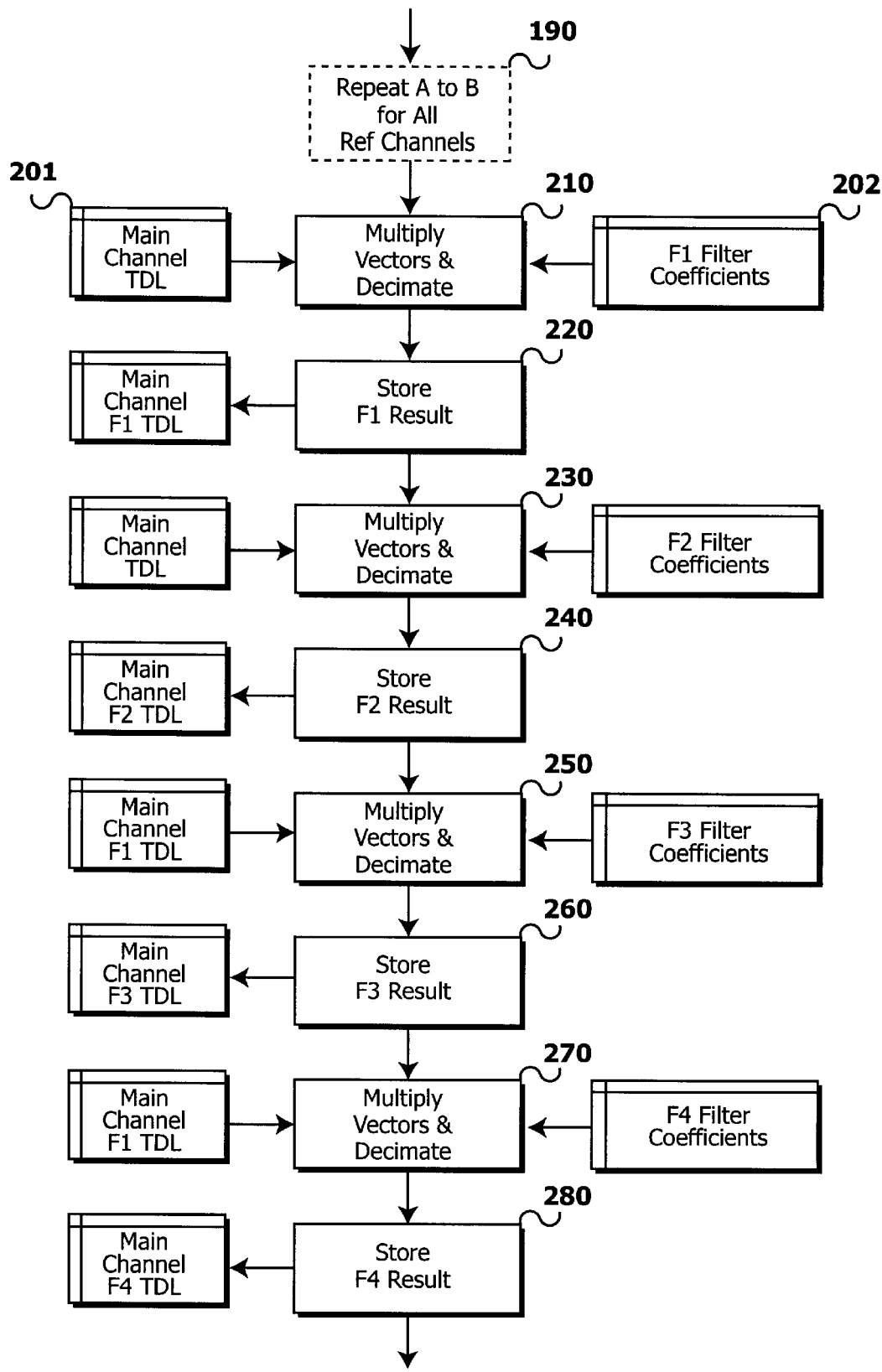
Figure 4C:
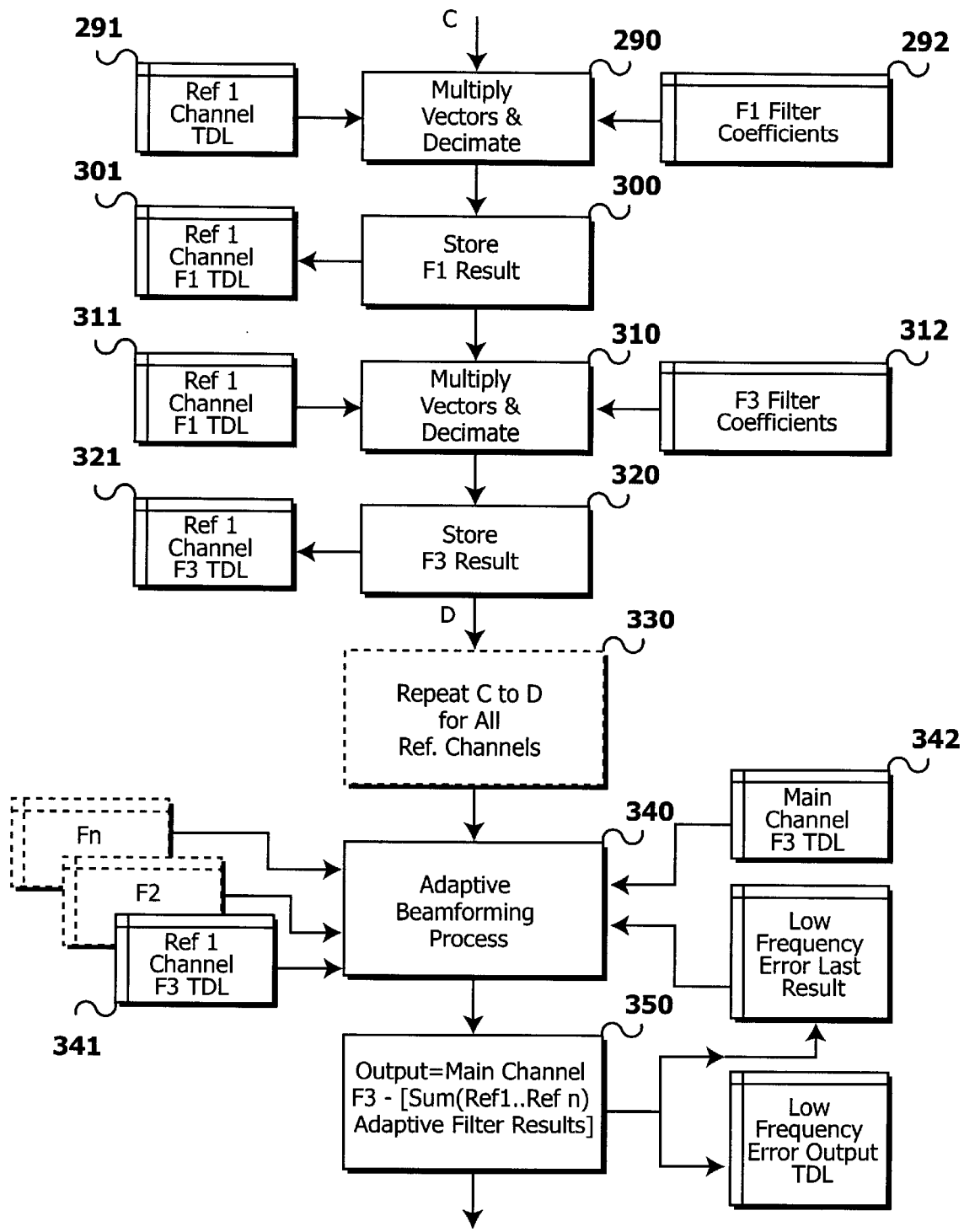
Figure 4D:
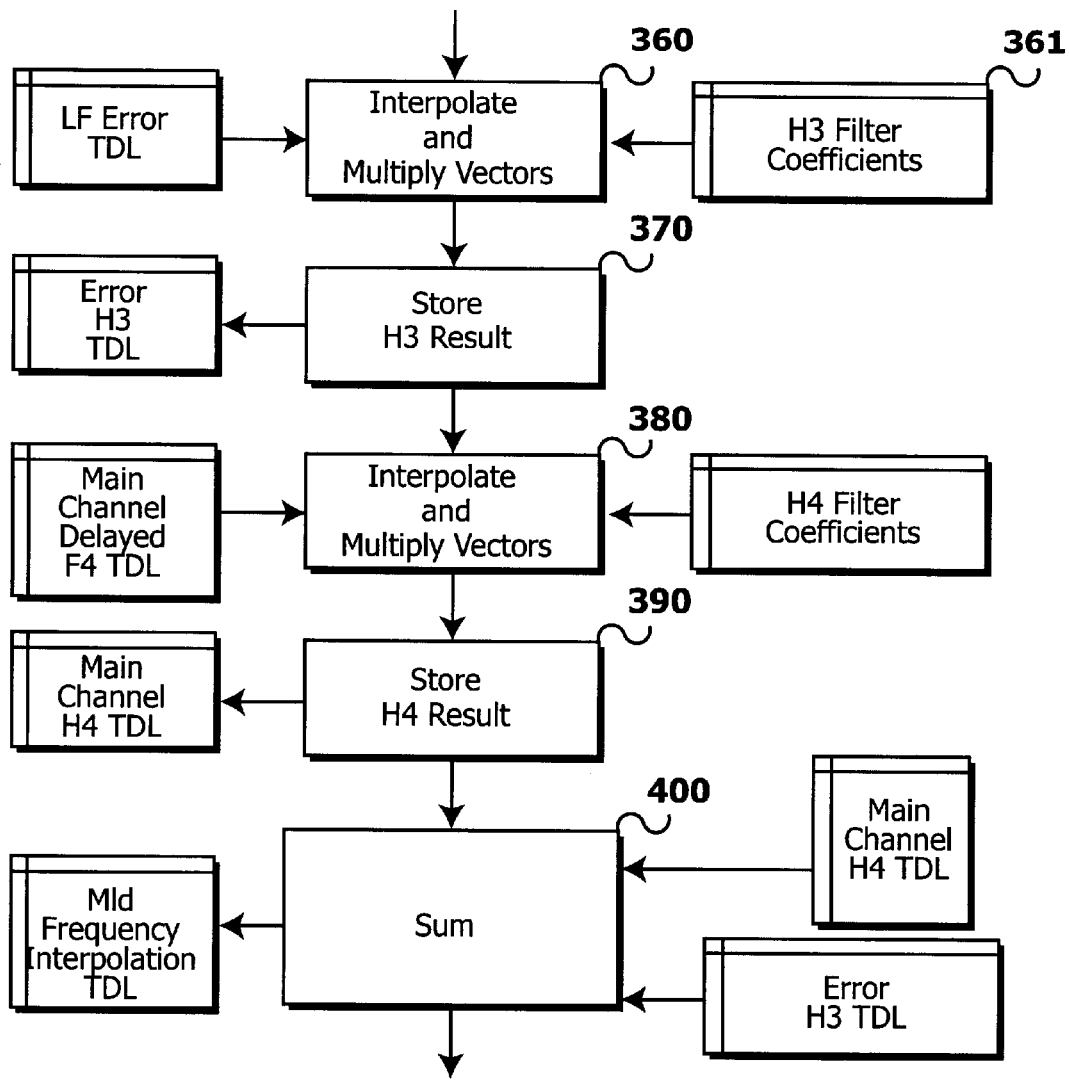
Figure 4E:
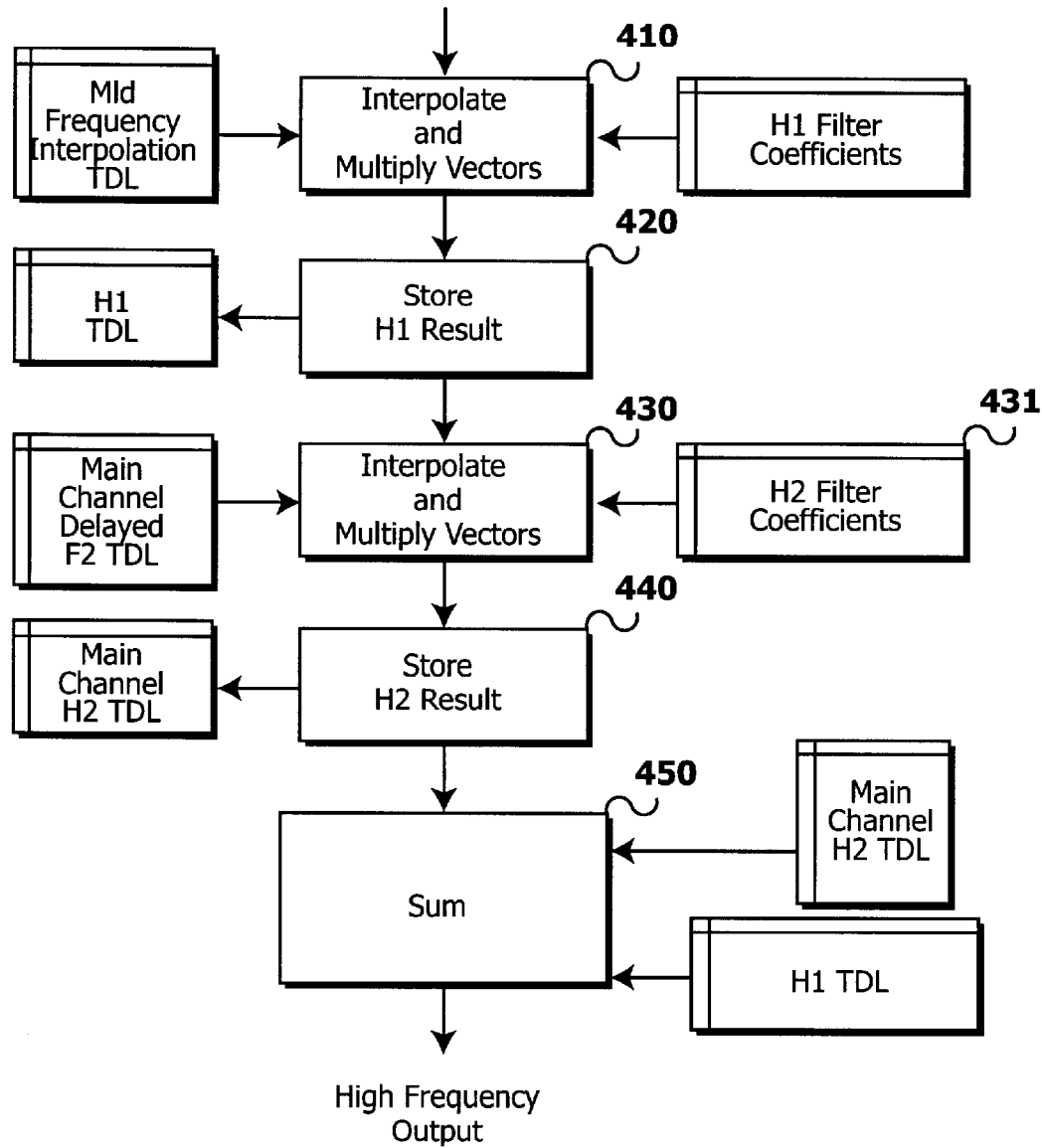

FIG. 3 shows yet another preferred embodiment similar to the previous embodiment except that an external main-channel generator is used instead of a main-channel matrix to obtain a broadband main channel. This embodiment is useful when it is desired to take advantage of the broadband capabilities of commercially available hi-fi microphones.

A broadband input is obtained by using an external main-channel generator, such as a shotgun microphone 43, a parabolic dish 44, or a dipole microphone. The broadband input is sampled through a high fidelity A-to-D converter 45. The sampling rate should preferably be high enough to maintain the broad bandwidth and the audio quality of the external main-channel generator.

A reference-channel matrix 42 is used to obtain low-frequency reference channels representing interferences in the low-frequency domain. Since adaptive filter processing is done in the low-frequency domain, the reference-channel matrix does not need a broadband capability.

A subtracter 50 is used to subtract cancelling signals estimating interferences from the broadband input. The broadband output is filtered by a low-pass filter 46 which also performs down-sampling. The low-pass filtered output and the low-frequency reference channels are provided to an adaptive filter 47. The adaptive filter acts on these low frequency signals to generate low-frequency cancelling signals. In the meantime, the broadband input is delayed by a delay unit 48 so that it can be synchronized with the cancelling signals from the adaptive filter 47. The delay unit may be implemented by a series of registers or by a programmable delay. The low-frequency cancelling signals are converted to broadband cancelling signals by an interpolator 49 so that they can be subtracted from the broadband main channel to produce the broadband output.

It is noted that the adaptive filter used in the present invention is not limited to a particular kind of adaptive filter. For example, one can practice the present invention using the invention disclosed in applicant's commonly assigned and copending U.S. patent application Ser. No. 08/672,899, filed Jun. 27, 1996, entitled 'System and Method for Adaptive Interference Cancelling,' by inventor Joseph Marash and its corresponding PCT application WO 97/50186, published Dec. 31, 1997. Both applications are incorporated by reference herein in their entirety.

Specifically, the adaptive filter may include weight constraining means for truncating updated filter weight values to predetermined threshold values when each of the updated filter weight value exceeds the corresponding threshold value. The adaptive filter may further include inhibiting means for estimating the power of the main channel and the power of the reference channels and for generating an inhibit signal to the weight updating means based on normalized power difference between the main channel and the reference channels.

The weight constraining means may include a frequency-selective weight-control unit, which includes a Fast Fourier Transform (FFT) unit for receiving adaptive filter weights and performing the FFT of the filer weights to obtain frequency representation values, a set of frequency bins for storing the frequency representation values divided into a set of frequency bands, a set of truncating units for comparing the frequency representation values with a threshold assigned to each bin and for truncating the values if they exceed the threshold, a set of storage cells for temporarily storing the truncated values, and an Inverse Fast Fourier Transform (IFFT) unit for converting them back to the adaptive filter weights.

B. Software Implementation

The invention described herein may be implemented using a commercially available digital signal processor (DSP) such as Analog Device's 2100 Series or any other general purpose microprocessor. For more information on Analog Device 2100 Series, see Analog Device, ADSP-2100 Family User's Manual, 3rd Ed., 1995.

1. Sub-Band Processing

FIGS. 4A–4D are a flow chart depicting the operation of a program in accordance with the first preferred embodiment of the present invention using sub-band processing.

Upon starting at step 100, the program initializes registers and pointers as well as buffers (steps 110–120). When a sampling unit sends an interrupt (step 131) that samples are ready, the program reads the sample values (step 130), and stores them in memory (step 140).

The program retrieves the input values (step 151) and main-channel matrix coefficients (step 152) to generate a main channel by filtering the inputs values using the coefficients (step 150), and then stores the result in memory (step 160).

The program retrieves the input values (step 171) and reference-channel matrix coefficients (step 172) to generate a reference channel by filtering the input values using the coefficients (step 170), and then store the result (step 180). Steps 170 and 180 are repeated to generate all other reference channels (step 190).

The program retrieves the main channel (step 201) and the F1 filter coefficients (step 202) to generate an lower intermediate band with ½ of the sampling rate appropriate for the whole main channel by filtering the main channel with the coefficients and down-sampling the filtered output (step 210), and then stores the result (step 220). Similarly, the F2 filter coefficients are used to generate a upper intermediate band with ½ of the sampling rate (step 240). The F3 and F3 filter coefficients are used to further generate a lower sub-band with ¼ of the sampling rate (step 260) and a upper sub-band with ¼ of the sampling rate (step 280).

The program retrieves one of the reference channels (step 291) and the F1 filter coefficients (step 292) to generate an intermediate band with ½ of the sampling rate by filtering the reference channel with the coefficients and down-sampling the filtered output (step 290), and then stores the result (step 300). Similarly, the F2 filter coefficients are used to generate a lower sub-band with ¼ of the sampling rate (step 320). Steps 290–320 are repeated for all the other reference channels (step 330).

The program retrieves the reference channels (step 341) and the main channel (step 342) to generate cancelling signal using an adaptive beamforming process routine (step 340). The program subtracts the cancelling signals from the main channel to cancel the interference component in the main channel (step 350).

The program then interpolates the output from the adaptive beamforming process routine (step 360) and filtering the output with the H3 filter coefficients (step 361) to obtain an up-sampled version (step 370). The program also interpolates the main channel in the lower band (step 380) and filters it with the H4 filter coefficients (step 381) to obtain an up-sampled version (step 390). The program combines the up-sampled versions to obtain a lower intermediate main channel (step 400).

The program interpolates the lower intermediate main channel (step 410) and filters it with the H1 filter coefficients (step 420) to obtain an up-sampled version (step 420). The program also interpolates the upper intermediate main channel (step 430) and filters it with the H2 filter coefficients (step 431) to obtain an up-sampled version (step 440). The program combines the up-sampled versions to obtain a broadband output (step 450).

2. Broadband Processing with Frequency-Limited Adaptation

Figure 5A:
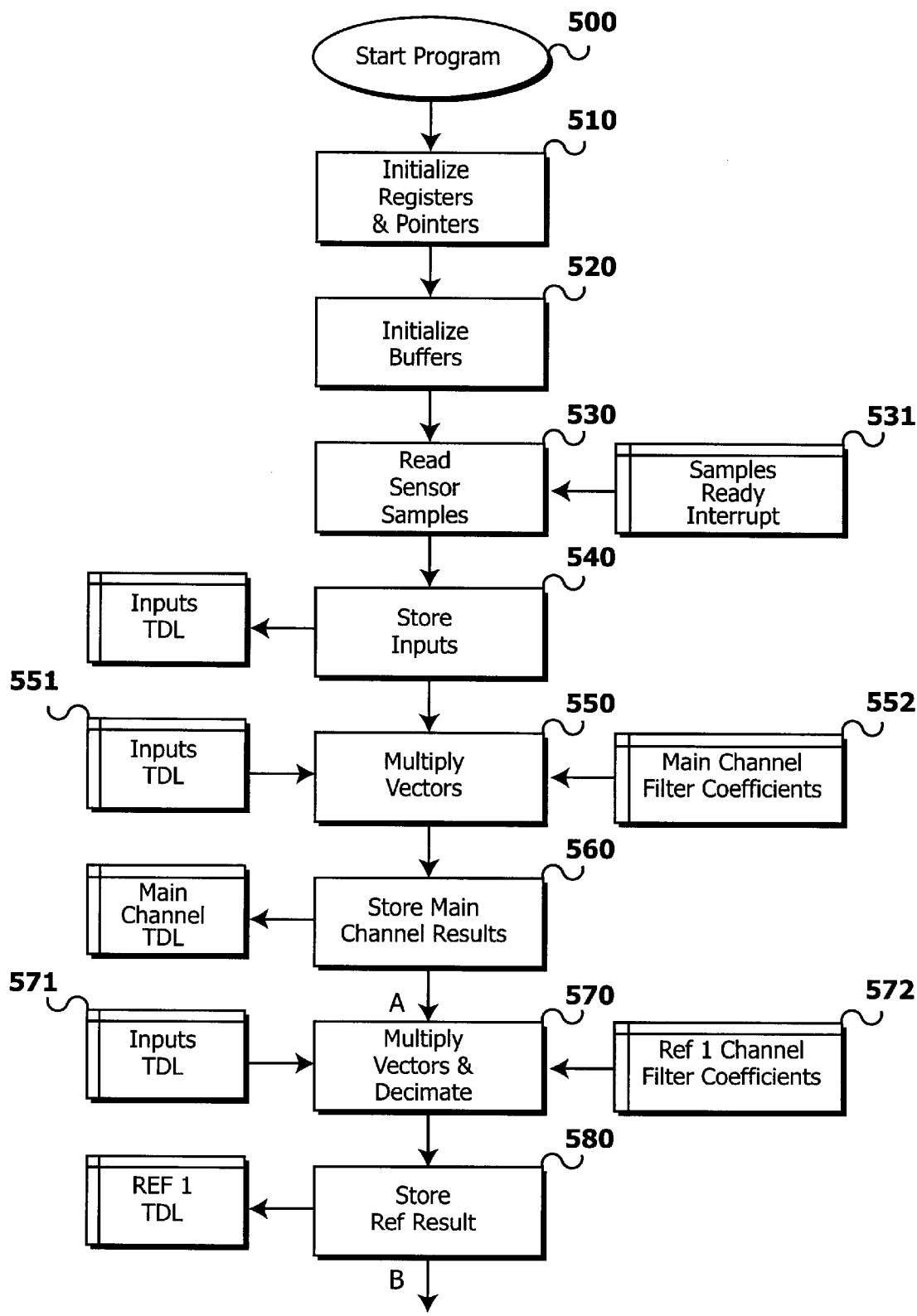
FIGS. 5A–5C are a flow chart depicting the operation of a program that may be used to implement a method using broadband processing with frequency-limited adaptation.
Figure 5B:
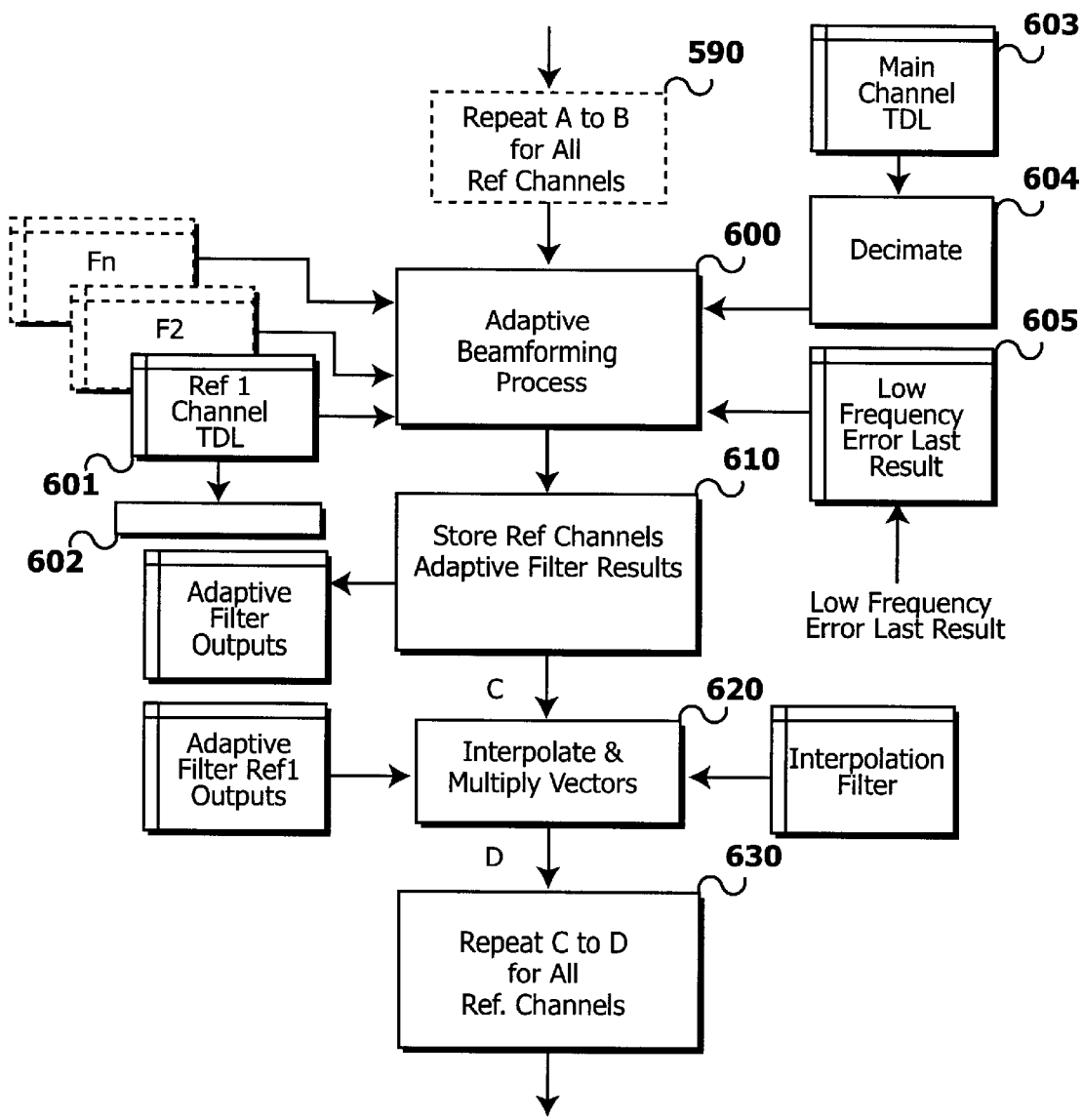
Figure 5C:
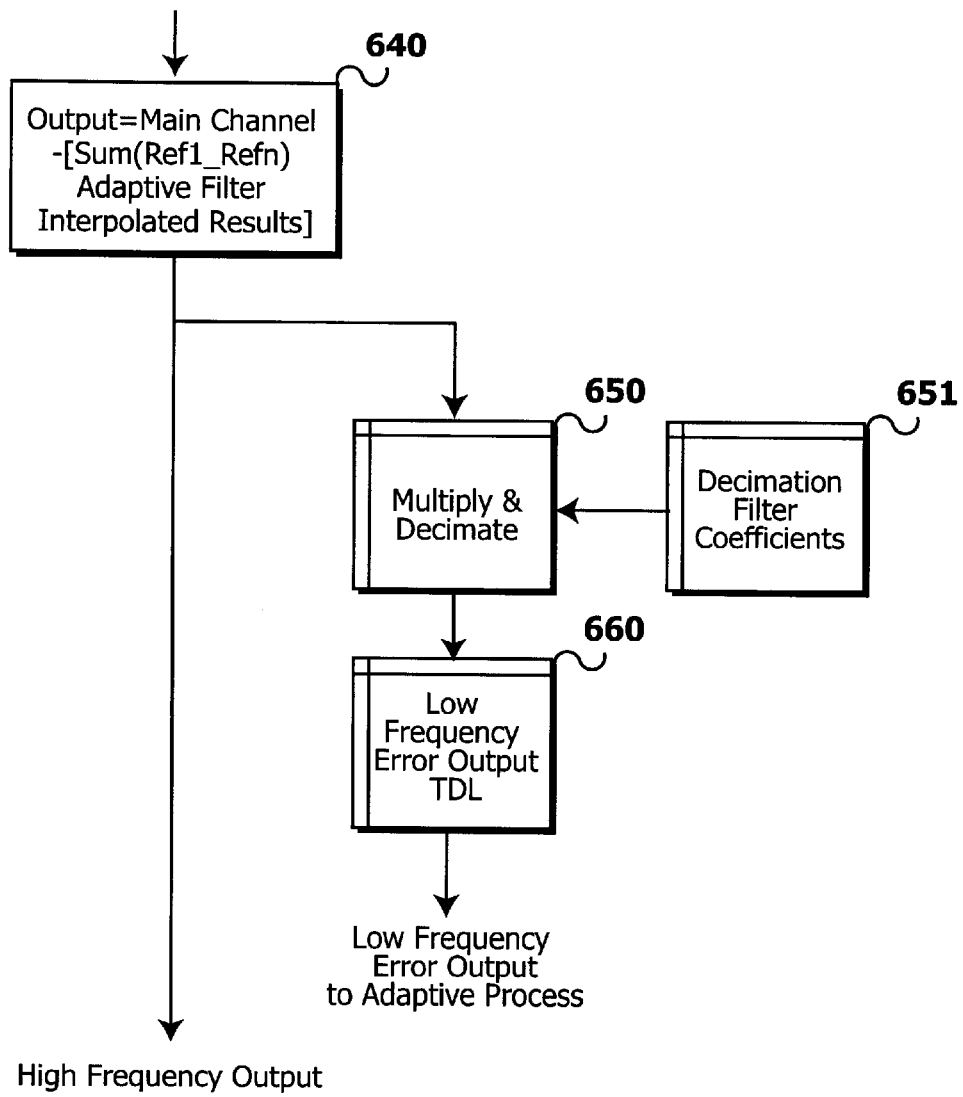

FIGS. 5A–5C are a flow chart depicting the operation of a program in accordance with the second preferred embodiment of the present invention using broadband processing with frequency-limited adaptation.

Upon starting at step 500, the program initializes registers and pointers as well as buffers (steps 510–520). When a sampling unit sends an interrupt (step 531) that the samples are ready, the program reads the sample values (step 530), and stores them in memory (step 540).

The program retrieves the broadband sample values (step 551) and the main-channel matrix coefficients (step 552) to generate a broadband main channel by filtering the broadband sample values with the coefficients (step 550), and then stores the result in memory (step 560).

The program retrieves the broadband samples (step 571) and reference-channel matrix coefficients (step 572) to generate a broadband reference channel by filtering the samples using the coefficients (step 570), and then stores the result (step 580). Steps 570 and 580 are repeated to generate all the other reference channels (step 590).

The program retrieves the reference channels (step 601) which are down-sampled (step 602), the main channel (step 603) which is also down-sampled to the low sampling rate (step 604), and the low-frequency output (step 605) to generate a low-frequency cancelling signal (step 600) using an adaptive beamforming process routine. The program updates the adaptive filter weights (step 610) and interpolates the low-frequency cancelling signal to generate a broadband cancelling signal (step 620). Steps 610–620 are repeated for all the other reference channels (step 630).

The program subtracts the cancelling signals from the main channel to cancel the interference component in the main channel (step 640).

The program filters and interpolates the broadband output (step 650) so that the low-frequency output can fed back to update the adaptive filter weights.

3. Broadband Processing with an External Main-Channel generator

Figure 6A:
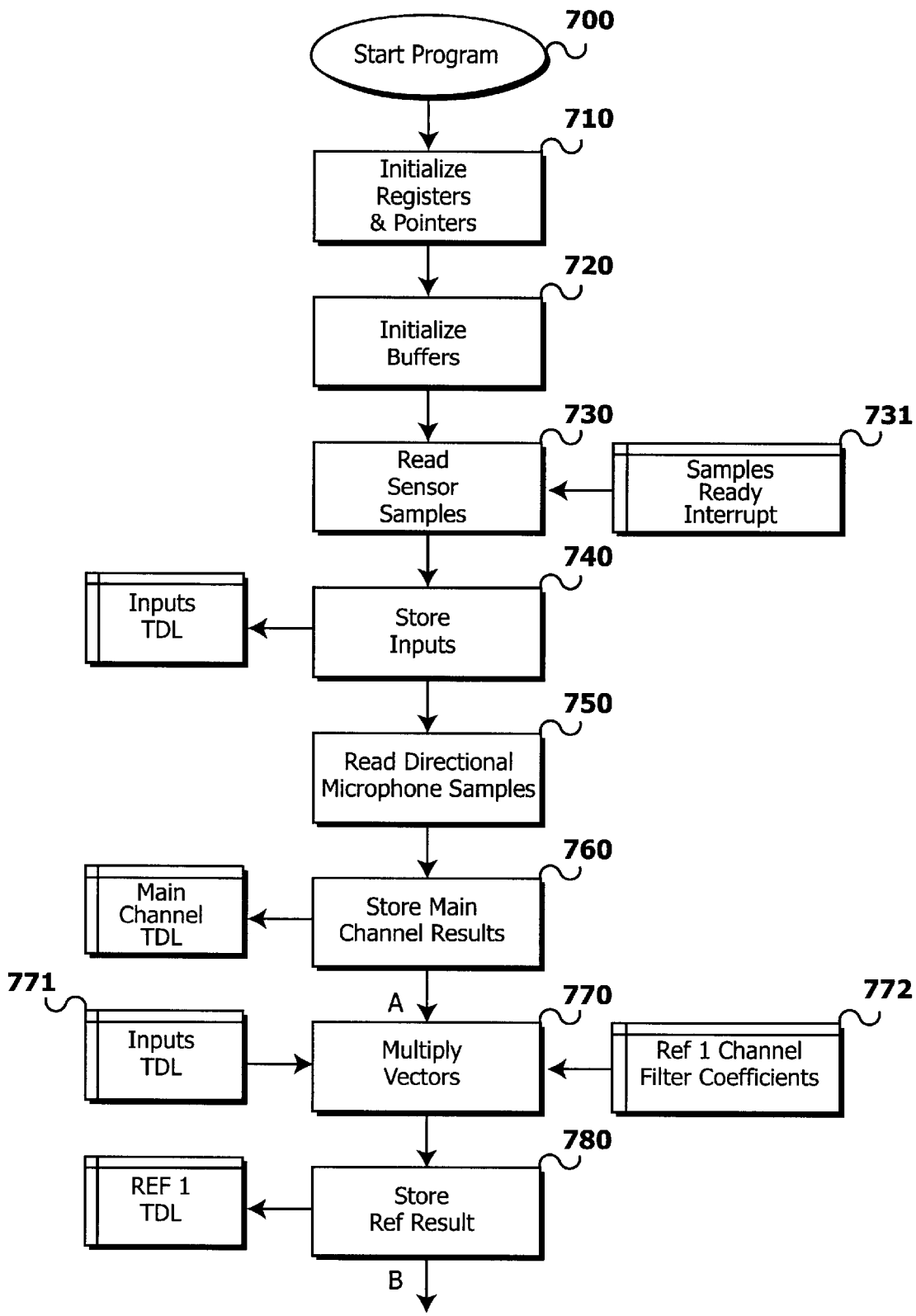
FIGS. 6A–6C are a flow chart depicting the operation of a program that may be used to implement a method using broadband processing with an external main-channel generator.
Figure 6B:
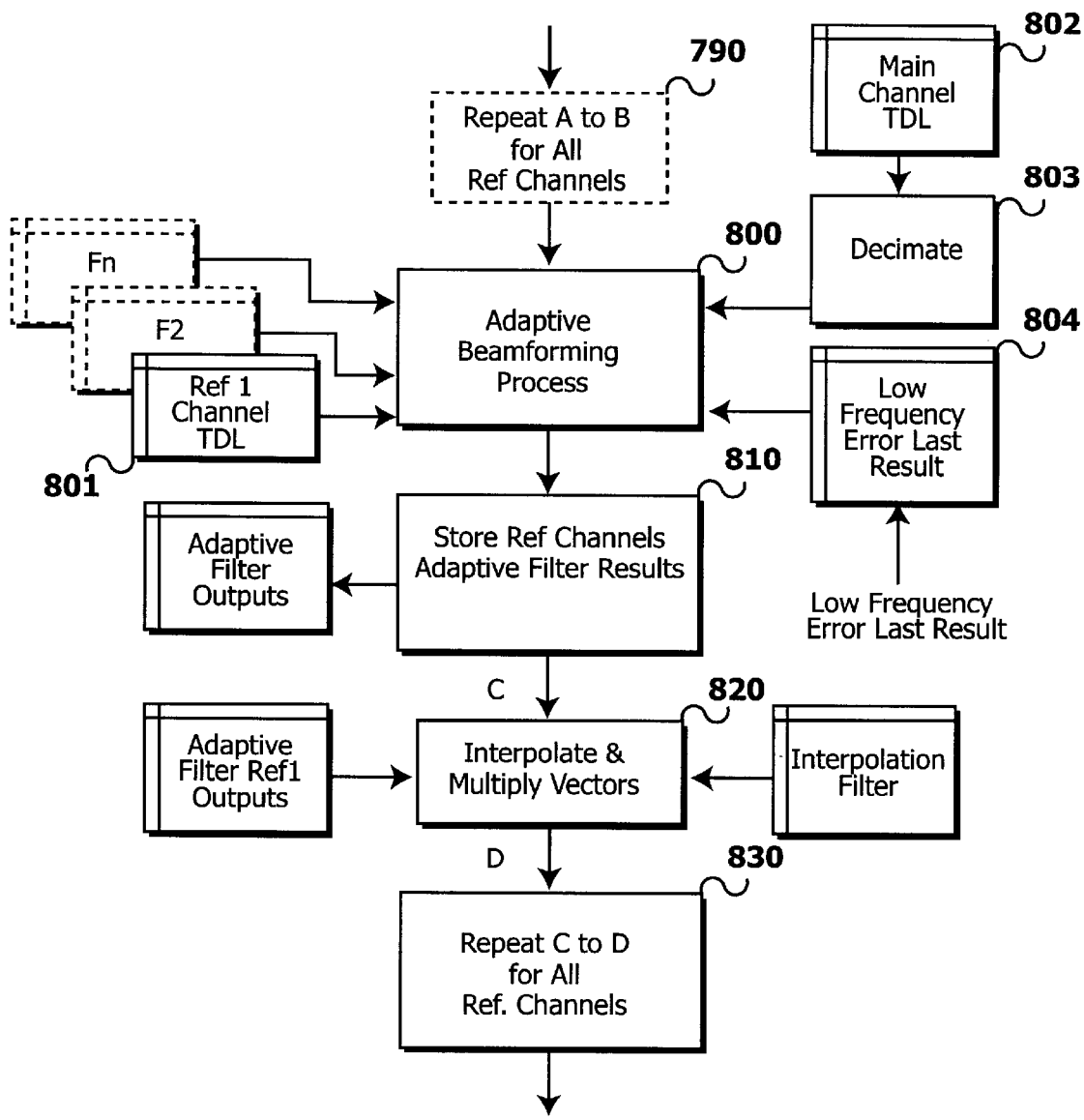
Figure 6C:
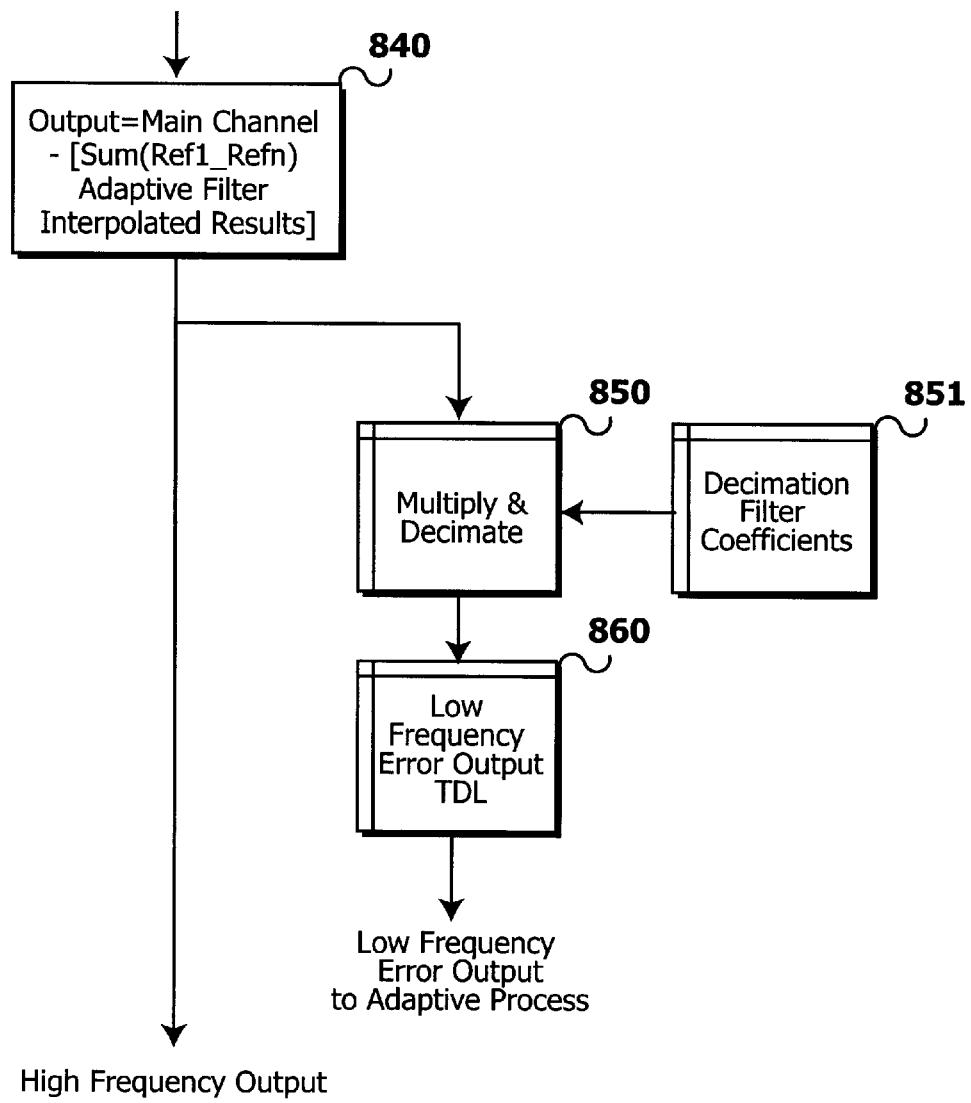

FIGS. 6A–6C are a flow chart depicting the operation of a program in accordance with the third preferred embodiment of the present invention using broadband processing with an external main-channel generator.

Upon starting at step 700, the program initializes registers and pointers as well as buffers (steps 710–720). When a sampling unit sends an interrupt (step 731) that samples are ready, the program reads the sample values (step 730), and stores them in memory (step 740).

The program then reads a broadband input from the external main-channel generator (step 750), and stores it as a main channel (step 760).

The program retrieves the low-frequency input (step 771) and reference-channel matrix coefficients (step 772) to generate a reference channel by multiplying the two (step 770), and then stores the result (step 780). Steps 770 and 780 are repeated to generate all the other reference channels (step 790).

The program retrieves the low-frequency reference channels (step 801), the main channel (step 802) which is down-sampled (step 803), and a low-frequency output (step 604) to generate low-frequency cancelling signals (step 600) using an adaptive beamforming process routine. The program updates the adaptive filter weights (step 810) and interpolates the low-frequency cancelling signal to generate the broadband cancelling signal (step 820). Steps 810–820 are repeated for all the other reference channels (step 830).

The program subtracts the broadband cancelling signals from the broadband main channel to generate the broadband output with substantially reduced interferences (step 840).

The program low-pass filters and interpolates the broadband output (step 850) so that the low-frequency output can fed back to update the adaptive filter weights.

While the invention has been described with reference to several preferred embodiments, it is not intended to be limited to those embodiments. It will be appreciated by those of ordinary skill in the art that many modifications may be made to the structure and form of the described embodiments without departing from the spirit and scope of the invention, which is defined and limited only in the following claims. As but one example, one of the reference channels may be obtained by measuring the vibration of an interference source using an accelerometer instead of using a microphone. The disclosed invention may also be used for processing radar signals from a phased-array antenna, or any other phenomena producing oscillatory waves detectable by any means whatsoever.

What is claimed is:

1. A dual-processing interference canceling system for processing an input signal containing a target signal component originating from a target source and an interference signal component originating from one or more interference sources and for producing an output signal representing the target signal component with a substantially reduced interference signal component, comprising:

a main-channel generator capable of receiving said input signal and for generating therefrom a broadband main channel having said target signal component and said interference component;

a reference-channel generator capable of receiving said input signal and for generating one or more broadband reference channels representing signals received from said one or more interference sources;

a first low-pass filter, connected to the reference-channel generator, for filtering said one or more broadband reference channels into one or more low-frequency reference channels;

an adaptive filter, connected to the first low-pass filter and having filter weights, for filtering said one or more low-frequency reference channels into one or more low-frequency canceling signals approximating the low-frequency interference signal component present in the broadband main channel;

an interpolator, connected to the adaptive filter, for interpolating said one or more low-frequency canceling signals into one or more broadband canceling signals;

a subtractor, connected to the main-channel generator and the interpolator, for generating a broadband output by subtracting said one or more broadband canceling signals from the broadband main channel;

a second low-pass filter for filtering the broadband output to produce a low-frequency output; and said adaptive filter having filter-weight-updating means for determining updated filter weight values for the adaptive filter such that the difference between the low-frequency output and said one or more low-frequency canceling signals is substantially minimized; said adaptive filter also having weight constraining means for truncating said updated filter weight values to predetermined threshold values when the updated filter weight value exceeds the corresponding threshold value.

2. The system of claim 1, wherein the adaptive filter further comprises:

inhibiting means, connected to receive signals from the first low-pass filter and the second low-pass filter, for estimating the power of the low-frequency output and the power of the low-frequency reference channels and for generating an inhibit signal to said filter-weight-updating means when a normalized power difference between the low-frequency output and the low-frequency reference channels is positive.

3. A dual-processing interference canceling system for processing an input signal containing a target signal component originating from a target source and an interference signal component originating from one or more interference sources and for producing an output signal representing the target signal component with a substantially reduced interference signal component, comprising:

a main-channel generator capable of receiving said input signal and for generating therefrom a broadband main channel having said target signal component and said interference component;

a reference-channel generator capable of receiving said input signal and for generating one or more broadband reference channels representing signals received from said one or more interference sources;

a first low-pass filter, connected to the reference-channel generator, for filtering said one or more broadband reference channels into one or more low-frequency reference channels;

an adaptive filter, connected to the first low-pass filter and having filter weights, for filtering said one or more low-frequency reference channels into one or more low-frequency canceling signals approximating the low-frequency interference signal component present in the broadband main channel;

an interpolator, connected to the adaptive filter, for interpolating said one or more low-frequency canceling signals into one or more broadband canceling signals;

a subtractor, connected to the main-channel generator and the interpolator, for generating a broadband output by subtracting said one or more broadband canceling signals from the broadband main channel;

a second low-pass filter for filtering the broadband output to produce a low-frequency output; and said adaptive filter having filter-weight-updating means for determining updated filter weight values for the adaptive filter such that the difference between the low-frequency output and said one or more low-frequency canceling signals is substantially minimized; said adaptive filter also having weight constraining means for converting the updated filter weight values to frequency representation values, truncating the frequency representation values at predetermined threshold values, and converting the truncated frequency representation values back to adaptive filter weights.

4. The system of claim 3, wherein the weight constraining means comprises:

a Fast Fourier Transform unit for generating frequency representation values of the updated filter weight values;

a set of frequency bins, each frequency bin for storing the frequency representation values for a frequency band assigned to each frequency bin;

a set of truncating means, each connected to the corresponding frequency bin, for truncating the frequency representation values stored in each frequency bin to a predetermined threshold value if the frequency representation values exceed the threshold value associated with each frequency bin; and an Inverse Fast Fourier Transform unit, connected to the set of truncating means, for converting values from the set of truncating means back to adaptive filter weights.

5. A dual-processing interference canceling system for processing an array of input signals containing a target signal component originating from a target source and an interference signal component originating from one or more interference sources and for producing an output signal representing the target signal component with a substantially reduced interference signal component, comprising:

a main-channel matrix capable of receiving said array of input signals and for generating therefrom a broadband main channel having said target signal component and said interference component;

a reference-channel matrix capable of receiving said array of input signals and for generating one or more broadband reference channels representing signals received from said one or more interference sources;

a first low-pass filter, connected to the reference-channel matrix, for filtering said one or more broadband reference channels into one or more low-frequency reference channels;

an adaptive filter, connected to the first low-pass filter and having filter weights, for filtering said one or more low-frequency reference channels into one or more low-frequency canceling signals approximating the low-frequency interference signal component present in the broadband main channel;

an interpolator, connected to the adaptive filter, for interpolating said one or more low-frequency canceling signals into one or more broadband canceling signals;

a subtractor, connected to the main-channel matrix and the interpolator, for generating a broadband output by subtracting said one or more broadband canceling signals from the broadband main channel;

a second low-pass filter for filtering the broadband output to produce a low-frequency output; and said adaptive filter having filter-weight-updating means for determining updated filter weight values for the adaptive filter such that the difference between the low-frequency output and said one or more low-frequency canceling signals is substantially minimized; said adaptive filter also having weight constraining means for truncating said updated filter weight values to predetermined threshold values when the updated filter weight value exceeds the corresponding threshold value.

6. The system of claim 5, wherein the adaptive filter further comprises:

inhibiting means, connected to receive signals from the first low-pass filter and the second low-pass filter, for estimating the power of the low-frequency output and the power of the low-frequency reference channels and for generating an inhibit signal to said filter-weight-updating means when a normalized power difference between the low-frequency output and the low-frequency reference channels is positive.

7. A dual-processing interference canceling system for processing an array of input signals containing a target signal component originating from a target source and an interference signal component originating from one or more interference sources and for producing an output signal representing the target signal component with a substantially reduced interference signal component, comprising:

a main-channel matrix capable of receiving said array of input signals and for generating therefrom a broadband main channel having said target signal component and said interference component;

a reference-channel matrix capable of receiving said array of input signals and for generating one or more broadband reference channels representing signals received from said one or more interference sources;

a first low-pass filter, connected to the reference-channel matrix, for filtering said one or more broadband reference channels into one or more low-frequency reference channels;

an adaptive filter, connected to the first low-pass filter and having filter weights, for filtering said one or more low-frequency reference channels into one or more low-frequency canceling signals approximating the low-frequency interference signal component present in the broadband main channel;

an interpolator, connected to the adaptive filter, for interpolating said one or more low-frequency canceling signals into one or more broadband canceling signals;

a subtractor, connected to the main-channel matrix and the interpolator, for generating a broadband output by subtracting said one or more broadband canceling signals from the broadband main channel;

a second low-pass filter for filtering the broadband output to produce a low-frequency output; and said adaptive filter having filter-weight-updating means for determining updated filter weight values for the adaptive filter such that the difference between the low-frequency output and said one or more low-frequency canceling signals is substantially minimized; said adaptive filter also having weight constraining means for converting the updated filter weight values to frequency representation values, truncating the frequency representation values at predetermined threshold values, and converting the truncated frequency representation values back to adaptive filter weights.

8. The system of claim 7, wherein the weight constraining means comprises:

a Fast Fourier Transform unit for generating frequency representation values of the updated filter weight values;

a set of frequency bins, each frequency bin for storing the frequency representation values for a frequency band assigned to each frequency bin;

a set of truncating means, each connected to the corresponding frequency bin, for truncating the frequency representation values stored in each frequency bin to a predetermined threshold value if the frequency representation values exceed the threshold value associated with each frequency bin; and an Inverse Fast Fourier Transform unit, connected to the set of truncating means, for converting values from the set of truncating means back to adaptive filter weights.

9. A dual-processing interference canceling system for processing an input signal containing a target signal component originating from a target source and an interference signal component originating from one or more interference sources and for producing an output signal representing the target signal component with a substantially reduced interference signal component, comprising:

an external main-channel generator capable of receiving said input signal and for generating therefrom a broadband main channel having said target signal component and said interference component;

a reference-channel generator capable of receiving said input signal and for generating one or more broadband reference channels representing signals received from said one or more interference sources;

a first low-pass filter, connected to the reference-channel generator, for filtering said one or more broadband reference channels into one or more low-frequency reference channels;

an adaptive filter, connected to the first low-pass filter and having filter weights, for filtering said one or more low-frequency reference channels into one or more low-frequency canceling signals approximating the low-frequency interference signal component present in the broadband main channel;

an interpolator, connected to the adaptive filter, for interpolating said one or more low-frequency canceling signals into one or more broadband canceling signals;

a subtractor, connected to the external main-channel generator and the interpolator, for generating a broadband output by subtracting said one or more broadband canceling signals from the broadband main channel;

a second low-pass filter for filtering the broadband output to produce a low-frequency output; and said adaptive filter having filter-weight-updating means for determining updated filter weight values for the adaptive filter such that the difference between the low-frequency output and said one or more low-frequency canceling signals is substantially minimized; said adaptive filter also having weight constraining means for truncating said updated filter weight values to predetermined threshold values when the updated filter weight value exceeds the corresponding threshold value.

10. The system of claim 9, wherein the adaptive filter further comprises:

inhibiting means, connected to receive signals from the low-pass filter and the low-frequency reference-channel generator, for estimating the power of the broadband main channel and the power of the broadband reference channels and for generating an inhibit signal to said filter-weight-updating means when a normalized power difference between the low-frequency output and the low-frequency reference channels is positive.

11. A dual-processing interference canceling system for processing an input signal containing a target signal component originating from a target source and an interference signal component originating from one or more interference sources and for producing an output signal representing the target signal component with a substantially reduced interference signal component, comprising:

an external main-channel generator capable of receiving said input signal and for generating therefrom a broadband main channel having said target signal component and said interference component;

a reference-channel generator capable of receiving said input signal and for generating one or more broadband reference channels representing signals received from said one or more interference sources;

a first low-pass filter, connected to the reference-channel generator, for filtering said one or more broadband reference channels into one or more low-frequency reference channels;

an adaptive filter, connected to the first low-pass filter and having filter weights, for filtering said one or more low-frequency reference channels into one or more low-frequency canceling signals approximating the low-frequency interference signal component present in the broadband main channel;

an interpolator, connected to the adaptive filter, for interpolating said one or more low-frequency canceling signals into one or more broadband canceling signals;

a subtractor, connected to the external main-channel generator and the interpolator, for generating a broadband output by subtracting, said one or more broadband canceling signals from the broadband main channel;

a second low-pass filter for filtering the broadband output to produce a low-frequency output; and said adaptive filter having filter-weight-updating means for determining updated filter weight values for the adaptive filter such that the difference between the low-frequency output and said one or more low-frequency canceling signals is substantially minimized; said adaptive filter also having weight constraining means for converting the updated filter weight values to frequency representation values, truncating the frequency representation values at predetermined threshold values, and converting the truncated frequency representation values back to adaptive filter weights.

12. The system of claim 11, wherein the weight constraining means comprises:
   a Fast Fourier Transform unit for generating frequency representation values of the updated filter weight values;
   a set of frequency bins, each frequency bin for storing the frequency representation values for a frequency band assigned to each frequency bin;
   a set of truncating means, each connected to the corresponding frequency bin, for truncating the frequency representation values stored in each frequency bin to a predetermined threshold value if the frequency representation values exceed the threshold value associated with each frequency bin; and
   an Inverse Fast Fourier Transform unit, connected to the set of truncating means, for converting values from the set of truncating means back to adaptive filter weights.

13. A dual-processing interference canceling system for processing an array of input signals containing a target signal component originating from a target source and an interference signal component originating from one or more interference sources and for producing an output signal representing the target signal component with a substantially reduced interference signal component, comprising:
   an external main-channel matrix capable of receiving said array of input signals and for generating therefrom a broadband main channel having said target signal component and said interference component;
   a reference-channel matrix capable of receiving said array of input signals and for generating one or more broadband reference channels representing signals received from said one or more interference sources;
   a first low-pass filter, connected to the reference-channel matrix, for filtering said one or more broadband reference channels into one or more low-frequency reference channels;
   an adaptive filter, connected to the first low-pass filter and having filter weights, for filtering said one or more low-frequency reference channels into one or more low-frequency canceling signals approximating the low-frequency interference signal component present in the broadband main channel;
   an interpolator, connected to the adaptive filter, for interpolating said one or more low-frequency canceling signals into one or more broadband canceling signals;
   a subtractor, connected to the external main-channel matrix and the interpolator, for generating a broadband output by subtracting said one or more broadband canceling signals from the broadband main channel;
   a second low-pass filter for filtering the broadband output to produce a low-frequency output; and
   said adaptive filter having filter-weight-updating means for determining updated filter weight values for the adaptive filter such that the difference between the low-frequency output and said one or more low-frequency canceling signals is substantially minimized; said adaptive filter also having weight constraining means for truncating said updated filter weight values to predetermined threshold values when the updated filter weight value exceeds the corresponding threshold value.

14. The system of claim 13, wherein the adaptive filter further comprises:
   inhibiting means, connected to receive signals from the low-pass filter and the low-frequency reference-channel matrix, for estimating the power of the broadband main channel and the power of the broadband reference channels and for generating an inhibit signal to said filter-weight-updating means when a normalized power difference between the low-frequency output and the low-frequency reference channels is positive.

15. A dual-processing interference canceling system for processing an array of input signals containing a target signal component originating from a target source and an interference signal component originating from one or more interference sources and for producing an output signal representing the target signal component with a substantially reduced interference signal component, comprising:
   an external main-channel matrix capable of receiving said array of input signals and for generating therefrom a broadband main channel having said target signal component and said interference component;
   a reference-channel matrix capable of receiving said array of input signals and for generating one or more broadband reference channels representing signals received from said one or more interference sources;
   a first low-pass filter, connected to the reference-channel matrix, for filtering said one or more broadband reference channels into one or more low-frequency reference channels;
   an adaptive filter, connected to the first low-pass filter and having filter weights, for filtering said one or more low-frequency reference channels into one or more low-frequency canceling signals approximating the low-frequency interference signal component present in the broadband main channel;
   an interpolator, connected to the adaptive filter, for interpolating said one or more low-frequency canceling signals into one or more broadband canceling signals;
   a subtractor, connected to the external main-channel matrix and the interpolator, for generating a broadband output by subtracting said one or more broadband canceling signals from the broadband main channel;
   a second low-pass filter for filtering the broadband output to produce a low-frequency output; and
   said adaptive filter having filter-weight-updating means for determining updated filter weight values for the adaptive filter such that the difference between the low-frequency output and said one or more low-frequency canceling signals is substantially minimized; said adaptive filter also having weight constraining means for converting the updated filter weight values to frequency representation values, truncating the frequency representation values at predetermined threshold values, and converting the truncated frequency representation values back to adaptive filter weights.

16. The system of claim 15, wherein the weight constraining means comprises:
   a Fast Fourier Transform unit for generating frequency representation values of the updated filter weight values;

a set of frequency bins, each frequency bin for storing the frequency representation values for a frequency band assigned to each frequency bin;

a set of truncating means, each connected to the corresponding frequency bin, for truncating the frequency representation values stored in each frequency bin to a predetermined threshold value if the frequency representation values exceed the threshold value associated with each frequency bin; and an Inverse Fast Fourier Transform unit, connected to the set of truncating means, for converting values from the set of truncating means back to adaptive filter weights.

* * * * *